(12) United States Patent
Fagg

(10) Patent No.: US 8,212,592 B2
(45) Date of Patent: Jul. 3, 2012

(54) DYNAMIC LIMITERS FOR FREQUENCY DIVIDERS

(75) Inventor: Russell J. Fagg, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 258 days.

(21) Appl. No.: 12/633,681

(22) Filed: Dec. 8, 2009

(65) Prior Publication Data

US 2011/0043291 A1 Feb. 24, 2011

Related U.S. Application Data

(60) Provisional application No. 61/235,632, filed on Aug. 20, 2009.

(51) Int. Cl.
*H03K 21/00* (2006.01)
*H03K 23/00* (2006.01)
*H03K 25/00* (2006.01)

(52) U.S. Cl. ........ 327/115; 327/116; 327/117; 327/119; 327/122

(58) Field of Classification Search .................. 327/115, 327/116, 117, 118, 355–361, 202, 203, 208–212, 327/218; 377/47, 48
See application file for complete search history.

(56) References Cited

U.S. PATENT DOCUMENTS

| | | | |
|---|---|---|---|
| 7,062,247 B2 | 6/2006 | Kovacevic et al. | |
| 7,375,596 B2 | 5/2008 | Park et al. | |
| 7,521,976 B1 | 4/2009 | Sudjian et al. | |
| 7,557,664 B1 * | 7/2009 | Wu | 331/51 |
| 7,755,442 B2 | 7/2010 | Li et al. | |
| 2002/0008590 A1 | 1/2002 | Van Der Tang et al. | |
| 2004/0066241 A1 | 4/2004 | Gierkink et al. | |
| 2004/0251227 A1 * | 12/2004 | Perkins et al. | 211/189 |
| 2005/0110579 A1 * | 5/2005 | Raha | 331/16 |
| 2005/0253659 A1 | 11/2005 | Favrat et al. | |
| 2006/0208818 A1 * | 9/2006 | Lee et al. | 331/167 |
| 2007/0030090 A1 * | 2/2007 | Farnworth | 333/13 |
| 2009/0072917 A1 | 3/2009 | Yajima et al. | |
| 2009/0115540 A1 * | 5/2009 | Shen | 331/117 R |
| 2009/0134947 A1 * | 5/2009 | Tarng | 331/116 FE |

(Continued)

OTHER PUBLICATIONS

International Search Report and Written Opinion—PCT/US2010/046233, International Search Authority—European Patent Office—Dec. 7, 2010.

(Continued)

*Primary Examiner* — Lincoln Donovan
*Assistant Examiner* — Brandon S Cole
(74) *Attorney, Agent, or Firm* — Ramin Mobarhan

(57) ABSTRACT

Techniques for generating quadrature signals from a local oscillator signal, wherein the generated quadrature signals have a frequency half of the local oscillator frequency. In an exemplary embodiment, two oscillators, e.g., injection locked oscillators, are provided, each oscillator having a load, a cross-coupled transistor pair, an integrating capacitor, and current injection transistors. A differential pair is coupled to the leads of each of the integrating capacitors, and the drains of the differential pair are coupled to the outputs of the other oscillator to help increase the slew rate of the output voltages of the other oscillator. The inputs to the differential pair may be first amplified to improve the gain of the differential pair. In another exemplary embodiment, the power consumption of the differential pair may be reduced by operating them in a discontinuous mode, e.g., by coupling the source voltages of the differential pair to corresponding delayed versions of the drain voltages.

19 Claims, 9 Drawing Sheets

U.S. PATENT DOCUMENTS

2009/0251227 A1* 10/2009 Jasa .......................... 331/113 R
2011/0050296 A1* 3/2011 Fagg ............................ 327/118

OTHER PUBLICATIONS

Leung, Lincoln L. K. et al: "A 1-V, 9.7mW CMOS Frequency Synthesizer for WLAN 802.11a Transceivers," 2005 Symposium on VLSI Circuits Digest of Technical Papers. Piscataway, NJ, USA, (Jun. 16, 2005), pp. 252-255, XP010818423, DOI:10.1109/VLSIC.2005.1469379, ISBN: 978-4-900784-01-7.

Mazzanti A, et al., "Injection locked oscillators for quadrature generation radio frequency", Microelectronics, 2004. ICM 2004 Proceedings. The 16th International Conference on Tunis, Tunisia Dec. 6-8, 2004, Piscataway, NJ, USA,IEEE, Dec. 6, 2004, pp. 124-127, XP010800749, DOI: D0I:10.1109/ICM.2004.1434224 ISBN: 978-0-7803-8656-3.

Shao-Hua Lee, et al., "A Low Voltage Divide-by-4 Injection Locked Frequency Divider With Quadrature Outputs", IEEE Microwave and Wireless Components Letters, IEEE Service Center, New York, NY, US, vol. 16, No. 5, May 1, 2007, pp. 373-375, XP011180011, ISSN: 1531-1309.

Shibasaki T, et al., "20-GHz Quadrature Injection-Locked LC Dividers With Enhanced Locking Range", IEEE Journal of Solid-State Circuits, IEEE Service Center, Piscataway, NJ, US, vol. 43, No. 3, Mar. 1, 2008, pp. 610-618, XP011204874, ISSN: 0018-9200.

* cited by examiner

US 8,212,592 B2

DYNAMIC LIMITERS FOR FREQUENCY DIVIDERS

RELATED APPLICATIONS

This application claims priority to U.S. Provisional Pat. App. Ser. No. 61/235,632, entitled "Clocked limiters for frequency dividers," filed Aug. 20, 2009, the contents of which are hereby incorporated by reference herein in their entirety.

This application is related to U.S. patent application Ser. No. 12/553,498, entitled "Divide-by-two injection-locked ring oscillator circuit," filed Sep. 3, 2009, the contents of which are hereby incorporated by reference herein in their entirety.

BACKGROUND

1. Field

The disclosure relates to electronic circuit design, and in particular, to the design of quadrature frequency dividers.

2. Background

In the art of electronic circuit design, a frequency divider receives an oscillatory input signal and generates one or more oscillatory output signals that are divided down in frequency. A quadrature frequency divider (or "quadrature divider") generates at least two output signals which have a quadrature phase relationship with respect to one another. Quadrature dividers are used in wireless communication systems to, e.g., generate signals to be mixed with a received signal for down-conversion in a receiver, or with a signal to be transmitted for up-conversion in a transmitter.

The design of quadrature dividers for modern wireless communication devices presents various challenges, including the requirement to operate with a low supply voltage and minimal power consumption to increase the battery life of the communication device. It would be desirable to provide low-voltage, low-power techniques for designing quadrature frequency dividers.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
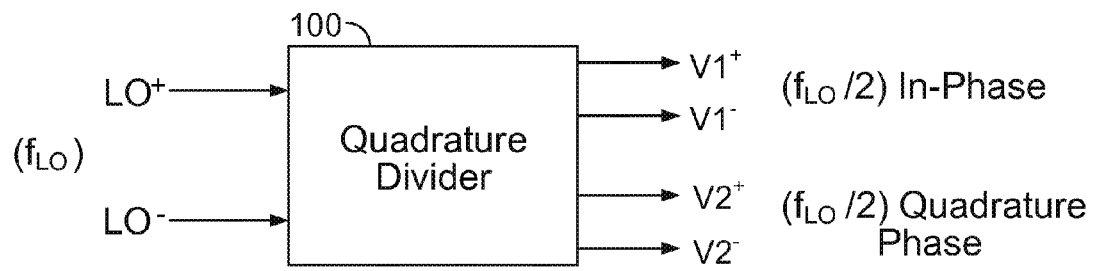
FIG. 1 illustrates the functionality of a quadrature divider according to the present disclosure.

FIG. 1 illustrates the functionality of a quadrature divider 100 according to the present disclosure. In FIG. 1, a differential local oscillator (LO) signal ($LO^+$, $LO^-$) is input to a quadrature divider 100. The LO signal has a frequency of $f_{LO}$. The quadrature divider 100 generates an in-phase (I) differential output voltage V1 of ($V1^+$, $V1^-$), and a quadrature phase (Q) differential output voltage V2 of ($V2^+$, $V2^-$). The frequency of each of V1 and V2 is $f_{LO}/2$, or half the LO frequency $f_{LO}$. Furthermore, the phase of V1 is designed to be 90 degrees offset from the phase of V2.

Figure 2A:
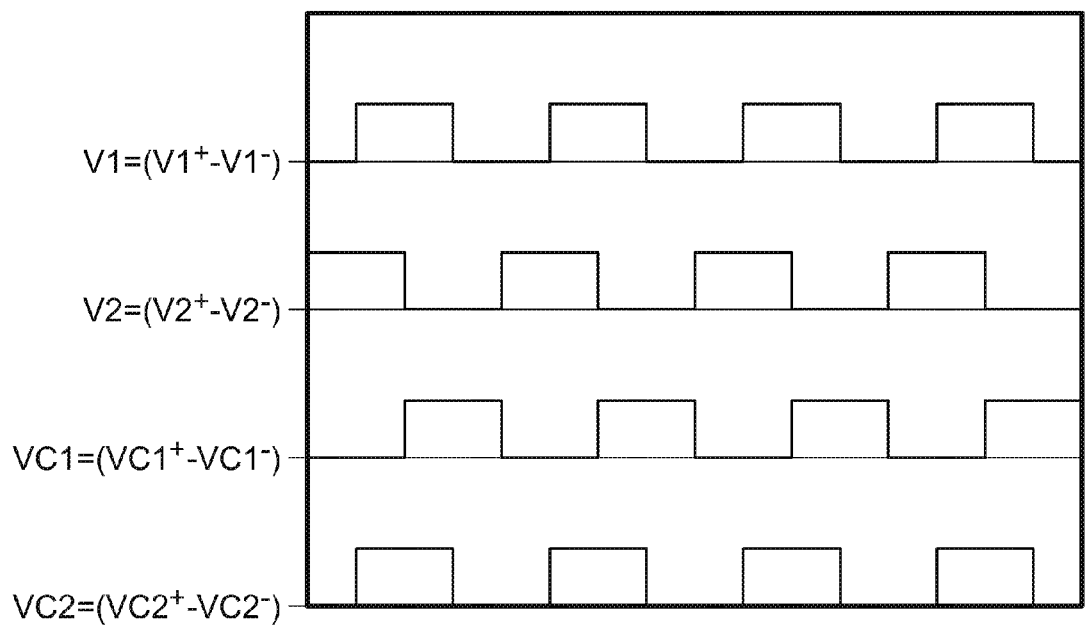
FIG. 2A illustrates signal timings present in the circuitry of FIG. 2.
Figure 2:
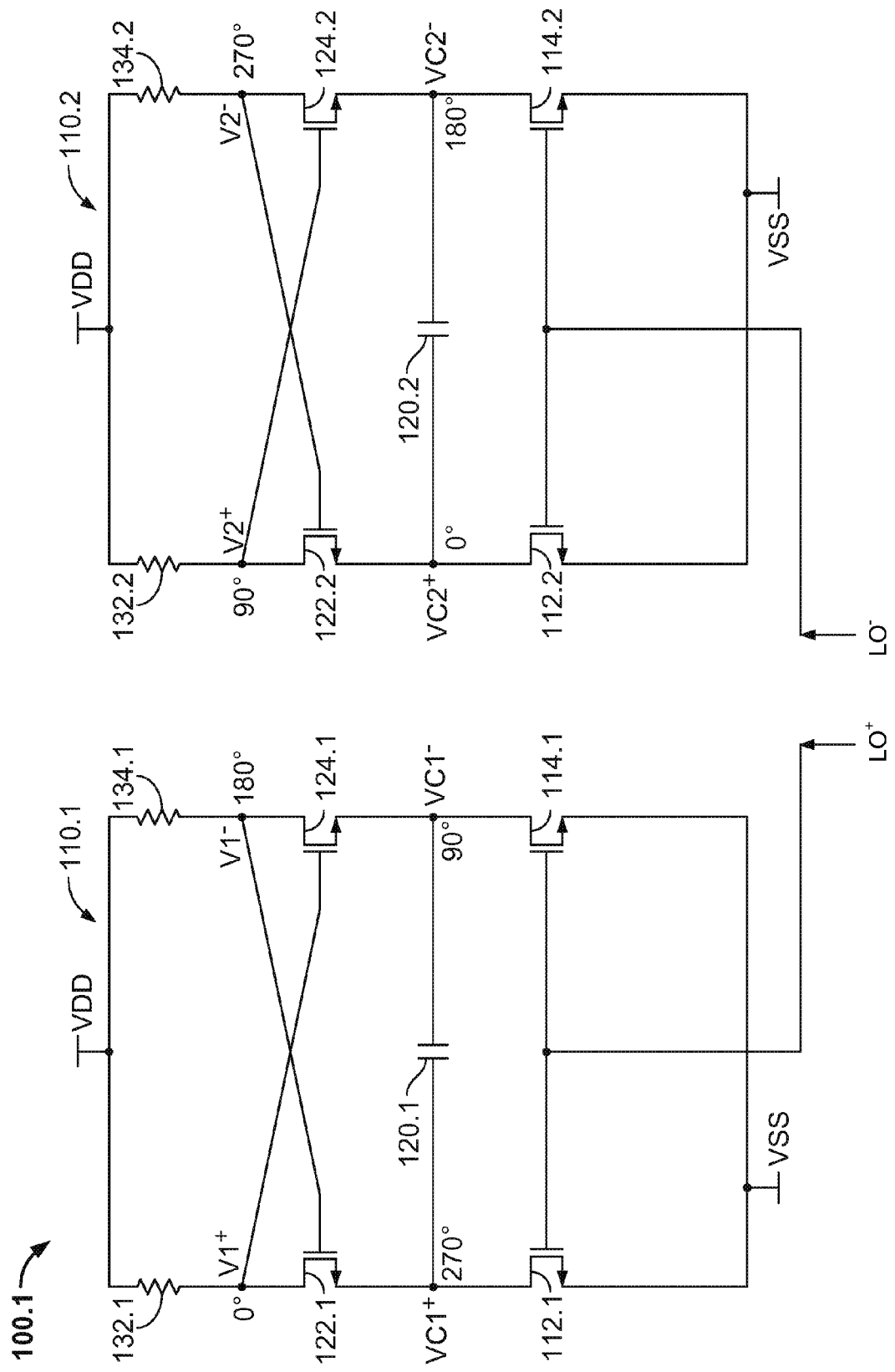
FIG. 2 illustrates an exemplary embodiment of a quadrature divider.

FIG. 2 illustrates an exemplary embodiment 100.1 of a quadrature divider. The quadrature divider 100.1 includes two oscillators 110.1 and 110.2. The combination of oscillators 110.1 and 110.2 may also be referred to as an "injection-locked ring oscillator circuit," although such a designation is not meant to limit the scope of the present disclosure in any way.

Oscillator 110.1 includes a pair of load resistors, 132.1 and 134.1, a cross-coupled transistor pair including NMOS transistors 122.1 and 124.1, an integrating capacitor 120.1, and a current injection circuit including NMOS transistors 112.1 and 114.1. In an exemplary embodiment, the resistance value of each of resistors 132.1 and 134.1 may be, e.g., 200 ohms. A first lead of the first resistor 132.1 and a first lead of the second resistor 134.1 are coupled to a first reference voltage, VDD. In an exemplary embodiment, VDD may be, e.g., 700 millivolts. A second lead of resistor 132.1 is coupled to the drain of transistor 122.1, whose drain voltage is also denoted $V1^+$. A second lead of resistor 134.1 is coupled to the drain of transistor 124.1, whose drain voltage is also denoted $V1^-$.

Note the gate of 122.1 is coupled to the drain of 124.1, and the gate of 124.1 is coupled to the drain of 122.1. The transconductance values of 122.1 and 124.1 are multiplied by the load resistance values to define a gain for the oscillator 110.1. This gain may be greater than one for division to occur. In an exemplary embodiment, a gain larger than two is employed for reliable division. Integrating capacitor 120.1 includes a first lead coupled to the source of 122.1 and a second lead coupled to the source of 124.1. In an exemplary embodiment, integrating capacitor 120.1 is a metal to metal capacitor having a capacitance value of tens to several hundred femtofarads. The drain of 112.1 is coupled to the first lead of integrating capacitor 120.1, and the drain of 114.1 is coupled to the second lead of integrating capacitor 120.1. In this example, 112.1 and 114.1 are similar to 122.1 and 124.1 in size. The source of 112.1 and the source of 114.1 are coupled to a second reference voltage VSS. For example, VSS may be a circuit ground voltage. In addition, the gates of 112.1 and 114.1 are coupled to the positive end $LO^+$ of the differential LO voltage ($LO^+$, $LO^-$).

Oscillator 110.2 is analogous to oscillator 110.1, and generates a differential quadrature voltage ($V2^+$, $V2^-$) from the negative end $LO^-$ of LO. Oscillator 110.2 also includes a pair of load resistors 132.2 and 134.2, a cross-coupled transistor pair including NMOS transistors 122.2 and 124.2, an integrating capacitor 120.2, and a current injection circuit including transistors 112.2 and 114.2.

It will be noted that oscillator 110.1 and oscillator 110.2 are clocked on opposite phases of input signal LO due to the communication of the $LO^+$ signal to oscillator 110.1 and the communication of the $LO^-$ signal to oscillator 110.2. In an exemplary embodiment, $LO^+$ and $LO^-$ are each an oscillatory waveform, and oscillate between approximately 100 millivolts and 1.3 volts.

FIG. 2A illustrates signal timings present in the circuitry of FIG. 2. In FIG. 2A, the differential voltage V1 is seen to oscillate at a given frequency. The differential voltage V2 is seen to oscillate the same frequency as V1, with the phase of V2 preceding the phase of V1 by 90 degrees. Further shown in FIG. 2A are the differential voltages VC1 and VC2, which correspond to the voltages across integrating capacitors 120.1 and 120.2, respectively.

Figure 3:
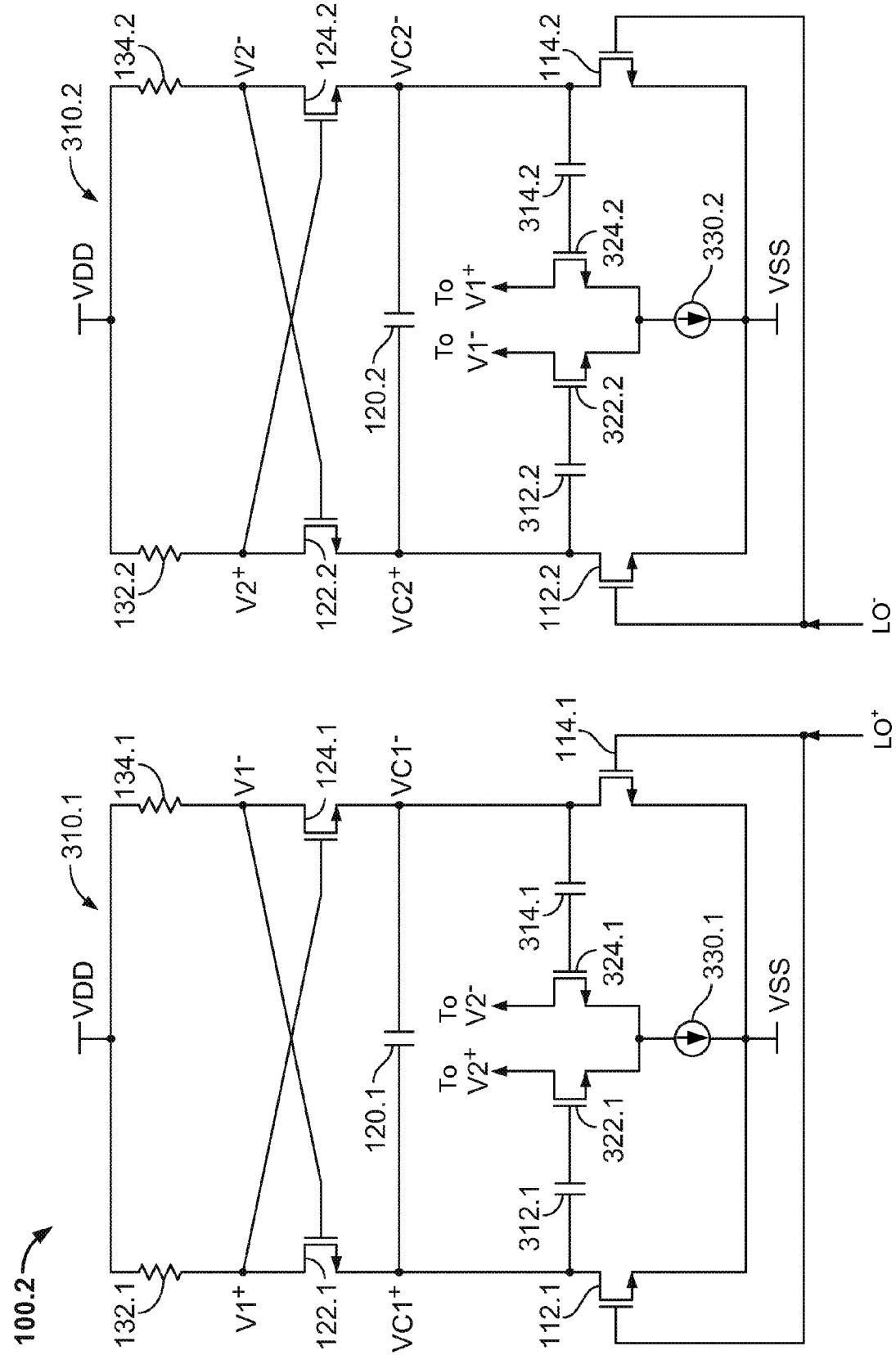
FIG. 3 illustrates an alternative exemplary embodiment of a quadrature divider including two oscillators.

FIG. 3 illustrates an alternative exemplary embodiment 100.2 of a quadrature divider including oscillators 310.1 and 310.2. Note similarly labeled elements in FIGS. 2 and 3 correspond to elements having similar functionality, unless otherwise noted.

In FIG. 3, the oscillator 310.1 includes differential pair transistors 322.1 and 324.1. Transistors 322.1 and 324.1 may be referred to herein as performing a "limiting" function, although such description is not meant to limit the scope of the present disclosure. The source of transistor 322.1 and the source of transistor 324.1 are coupled to a first lead of current source 330.1. A second lead of current source 330.1 is coupled to the second reference voltage VSS. The gate of transistor 322.1 is coupled to the voltage $VC1^+$ via Alternating Current (AC) coupling capacitor 312.1. AC coupling capacitor 312.1 is sized to block Direct Current (DC) offset voltage signals and pass high frequency (Alternating Current) AC voltage signals. Similarly, AC coupling capacitor 314.1 couples the gate of transistor 324.1 to the voltage $VC1^-$. The drain of transistor 322.1 is coupled to the voltage $V2^+$ of oscillator 310.2. As coupled together, current source 330.1, transistor 322.1, and resistor 132.2 operate as an inverting amplifier of a voltage signal present at the gate of transistor 322.1. The drain of transistor 324.1 is coupled to the voltage $V2^-$ of oscillator 310.2. As coupled together, current source 330.1, transistor 324.1, and resistor 134.2 operate as an inverting amplifier of a voltage signal present at the gate of transistor 324.1.

Oscillator 310.2 similarly includes differential transistors 322.2 and 324.2. Transistors 322.2 and 324.2 may also be referred to herein as performing a "limiting" function, although such description is not meant to limit the scope of the present disclosure. The source of transistor 322.2 and the source of transistor 324.2 are coupled to a first lead of current source 330.2. A second lead of current source 330.2 is coupled to circuit reference voltage VSS. The gate of transistor 322.2 is coupled to the voltage $VC2^+$ of oscillator 310.2 via Alternating Current (AC) coupling capacitor 312.2. AC coupling capacitor 312.2 is sized to block Direct Current (DC) offset voltage signals and pass high frequency (Alternating Current) AC voltage signals. Similarly, AC coupling capacitor 314.2 couples the gate of transistor 324.2 to the voltage $VC2^-$ of oscillator 310.2. The drain of transistor 322.2 is coupled to the voltage $V1^-$ of oscillator 310.1. As coupled together, current source 330.2, transistor 322.2, and resistor 134.1 operate as an inverting amplifier of a voltage signal present at the gate of transistor 322.2. The drain of transistor 324.2 is coupled to the voltage $V1^+$ of oscillator 310.1. As coupled together, current source 330.2, transistor 324.2, and resistor 132.1 operate as an inverting amplifier of a voltage signal present at the gate of transistor 324.2.

It will be appreciated that the voltage $VC1^+$ is passed by AC coupling capacitor 312.1 and inverted and amplified by the action of current source 330.1, transistor 322.1, and resistor 132.2 to match the phase of the voltage $V2^+$ of oscillator 310.2. By combining these signals, there is a total of two transistors 122.2 and 322.1 contributing to the generation of the voltage $V2^+$. This may improve the slew rate of the quadrature divider 100.2 in the presence of a load at its output, e.g., loading resistance and/or capacitance at the node supporting the voltage $V2^+$. In an analogous manner, transistors 122.1 and 324.2 contribute to the generation of $V1^+$, transistors 124.1 and 322.2 contribute to the generation of $V1^-$, and transistors 124.2 and 324.1 contribute to the generation of $V2^-$. By cross-coupling oscillators 310.1 and 310.2 at each oscillating node, phase noise is reduced, the deleterious effects of device mismatches on phase quadrature accuracy are also reduced, and larger capacitive loads can be driven by the quadrature divider 100.2 for a given supply current.

Further description of the exemplary embodiments shown in FIGS. 1-3 is given in U.S. patent application Ser. No. 12/553,498, earlier referenced herein.

Figure 4:
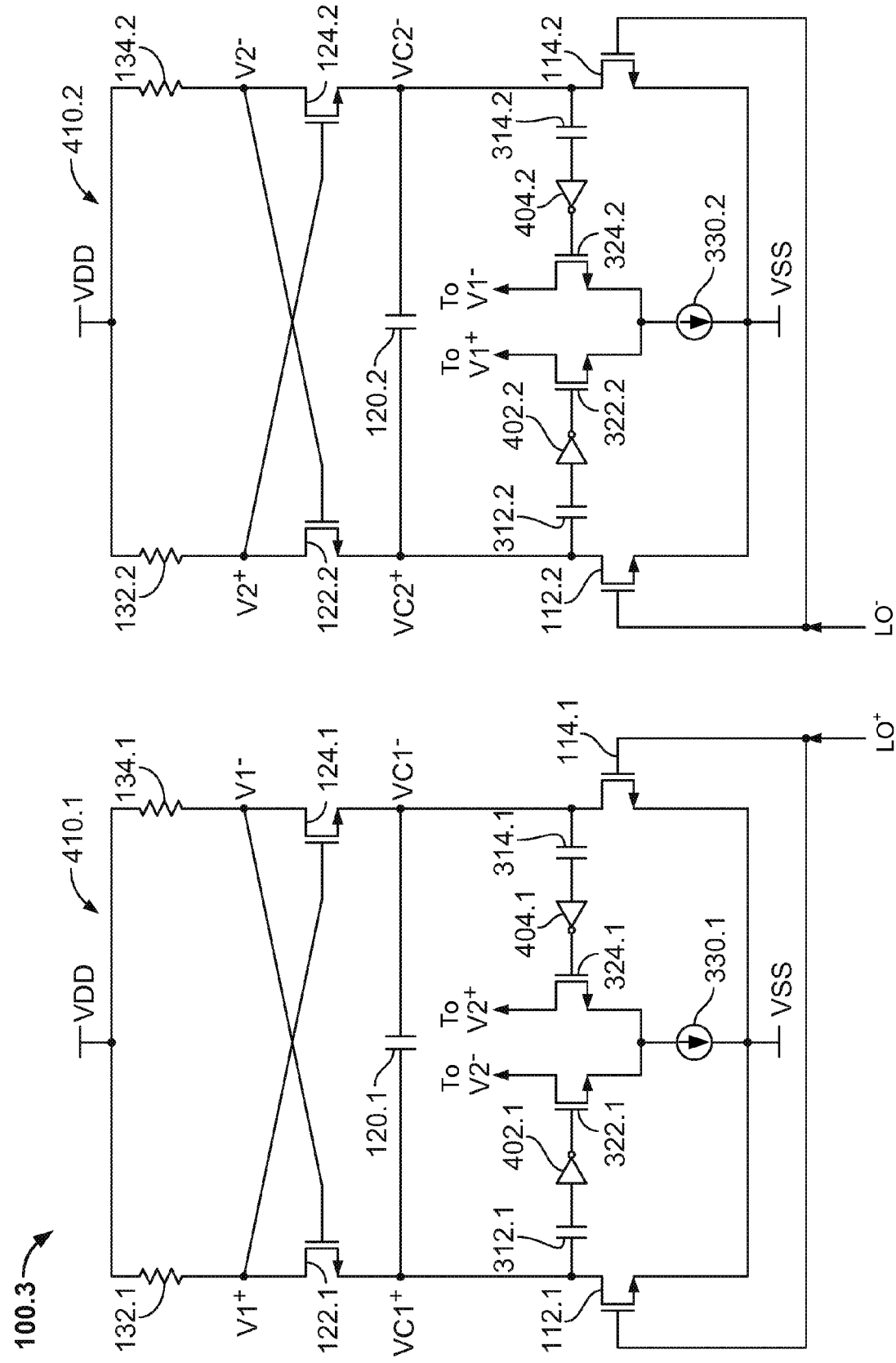
FIG. 4 illustrates an alternative exemplary embodiment of a quadrature divider including two oscillators.

FIG. 4 illustrates an alternative exemplary embodiment 100.3 of a quadrature divider including oscillators 410.1 and 410.2. Note similarly labeled elements in FIGS. 3 and 4 correspond to elements having similar functionality, unless otherwise noted.

In FIG. 4, the oscillator 410.1 is provided with inverting buffers 402.1 and 404.1 that couple capacitor 312.1 to transistor 322.1, and capacitor 314.1 to transistor 324.1, respectively. The inverting buffers 402.1 and 404.1 may advantageously help increase the voltage gain of the transistors 322.1 and 324.1, which further improves the slew rate of voltages $V2^+$ and $V2^-$ as previously described hereinabove. It will be appreciated that as the inverting buffers 402.1 and 404.1 may introduce a phase inversion into the corresponding buffered signals, the drains of transistors 322.1 and 324.1 may be coupled to voltages $V2^-$ and $V2^+$, respectively, in a manner reverse from the couplings illustrated for the quadrature divider 100.2 in FIG. 3. The oscillator 410.2 may also incorporate buffers 402.2 and 404.2 to similarly increase the slew rate of voltages $V1^+$ and $V1^-$.

Figure 4A:
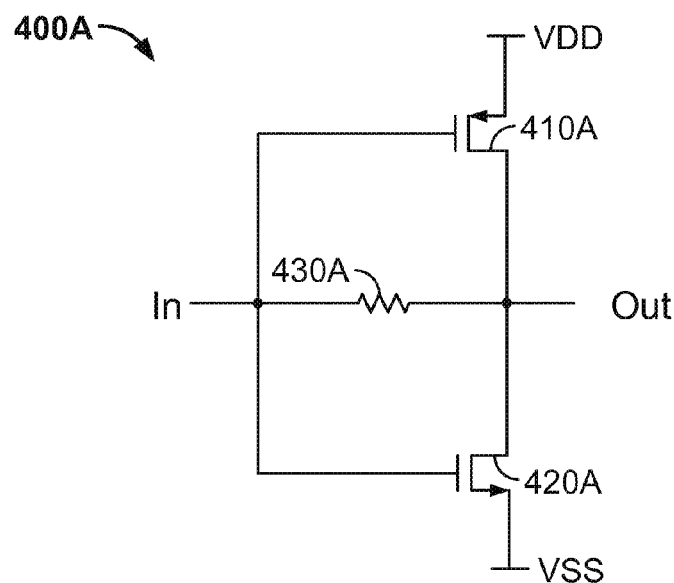
FIG. 4A illustrates an exemplary embodiment of an inverting buffer that may be used, e.g., for any of the buffers shown in FIG. 4.

FIG. 4A illustrates an exemplary embodiment 400A of an inverting buffer that may be used, e.g., for any of the buffers 402.1, 404.1, 402.2, and 404.2 shown in FIG. 4. The buffer 400A is an example of a self-biased inverting buffer known in the art, and includes transistors 410A and 420A coupled in an inverter configuration, and resistor 430A coupling the output to the input of the inverter for self-biasing.

Figure 5A:
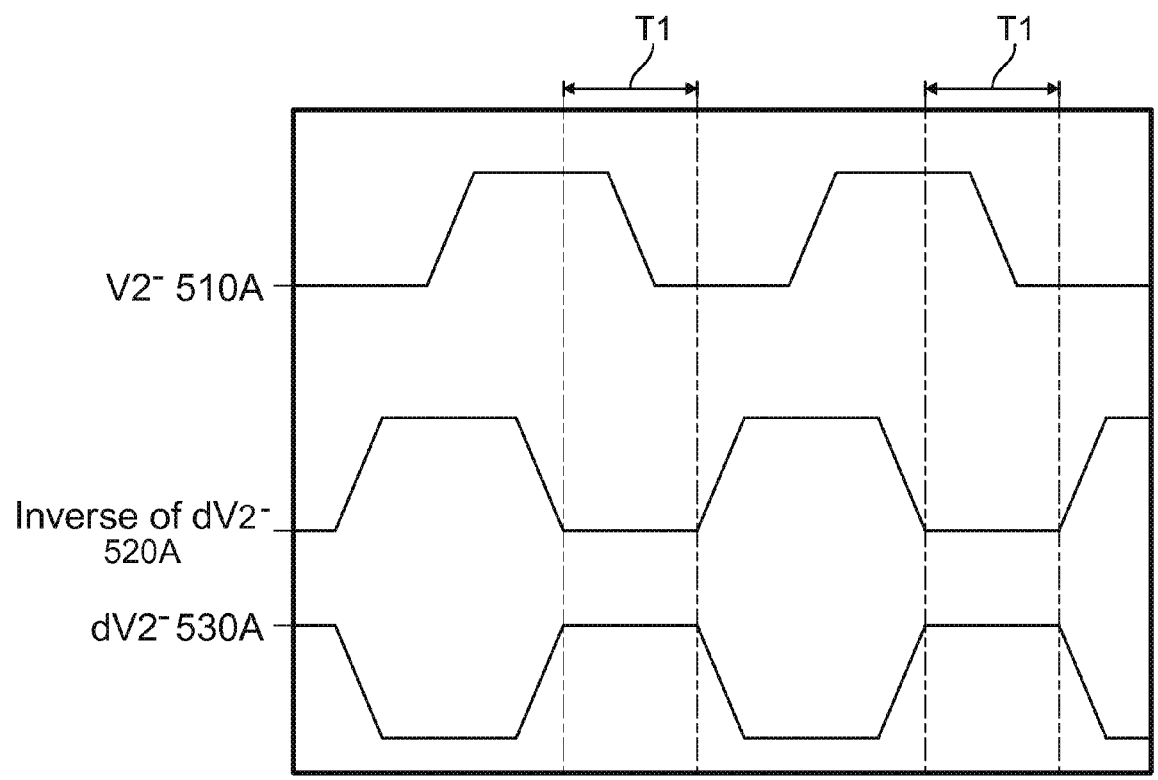
FIG. 5A describes the operation of the circuitry in FIG. 5.
Figure 5:
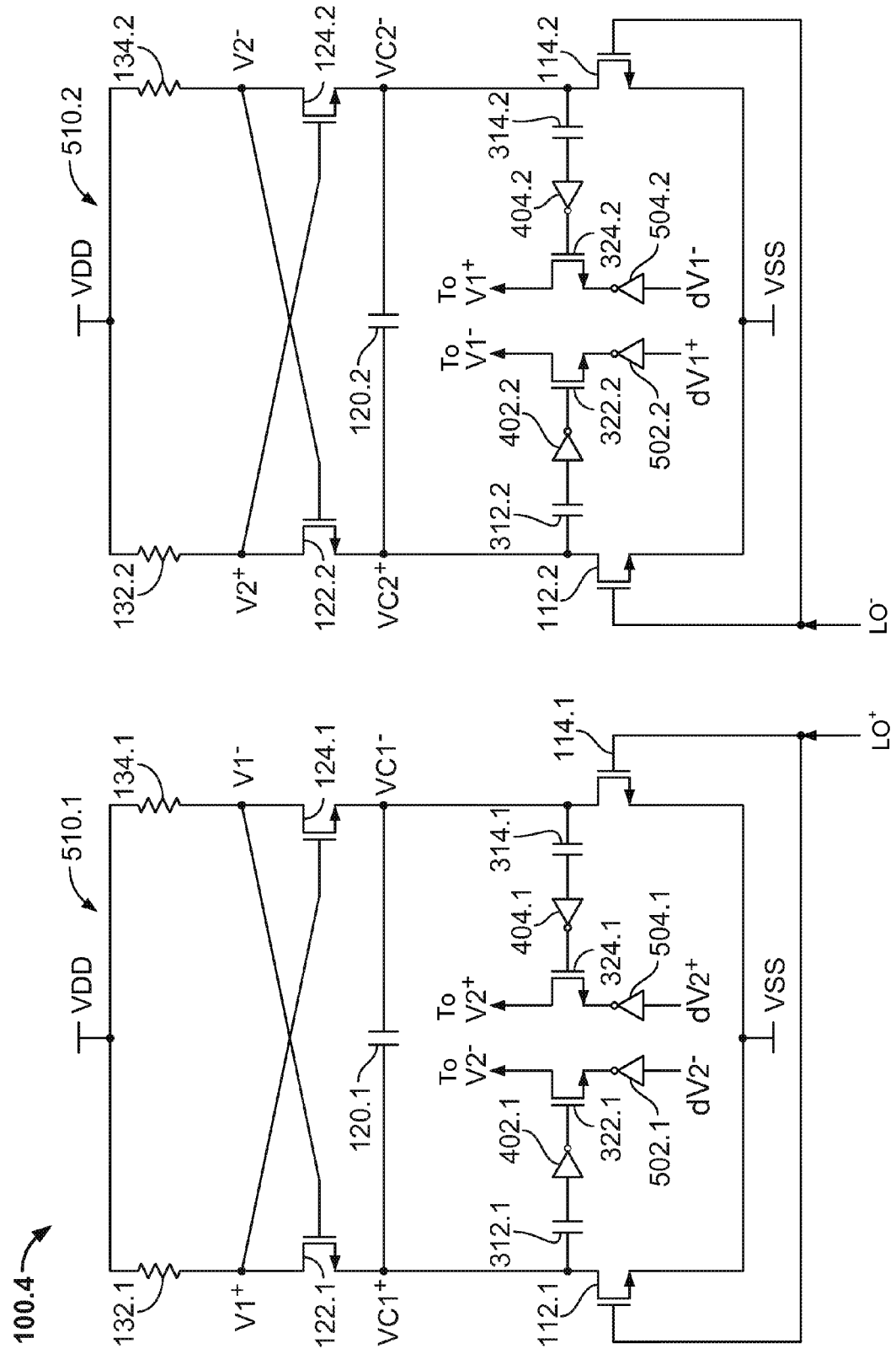
FIG. 5 illustrates an alternative exemplary embodiment of a quadrature divider including two oscillators.

FIG. 5 illustrates an alternative exemplary embodiment 100.4 of a quadrature divider including oscillators 510.1 and 510.2. Note similarly labeled elements in FIGS. 4 and 5 correspond to elements having similar functionality, unless otherwise noted.

In FIG. 5, the source of transistor 322.1 is coupled to the output of an inverting buffer 502.1, rather than to a current source 330.1 as illustrated in, e.g., the quadrature divider 100.3 of FIG. 4. The input of the inverting buffer 502.1 is coupled to a voltage $dV2^-$, which is designed to be a delayed version of the voltage $V2^-$. The operation of this circuitry is described with reference to FIG. 5A. FIG. 5A shows at 510A the voltage $V2^-$ over time. At 530A, a delayed version $dV2^-$ of $V2^-$ is shown, and at 520A an inverted version of $dV2^-$ is shown. It will be appreciated that the inverted version of $dV2^-$ at 520A is present at the output of the buffer 502.1 in FIG. 5.

During the time intervals indicated by T1, $V2^-$ is seen to transition from a high level to a low level, while the inverse of $dV2^-$ is seen to be maintained at a low level. It will be appreciated that while the inverse of $dV2^-$ is low, the source of transistor 322.1 in FIG. 5 is correspondingly low, and transistor 322.1 may thus be turned on during T1, and consume power, depending on the voltage level at its gate. Conversely, when the inverse of $dV2^-$ is not low (e.g., outside of the interval T1), the source of transistor 322.1 is correspondingly not low, and transistor 322.1 will be turned off, and thus consume little or no power. It will be appreciated that by allowing transistor 322.1 to be discontinuously turned on only during the period T1, transistor 322.1 may consume power only when $V2^-$ is being slewed from high to low, thereby advantageously saving power compared to an implementation wherein transistor 322.1 is always turned on (e.g., as in the quadrature divider 100.3 of FIG. 4).

As shown in FIG. 5, inverting buffers 504.1, 502.2, and 504.2 may be similarly employed to control transistors 324.1, 322.2, and 324.2, respectively. It will be appreciated that the use of the inverting buffers allows the corresponding transistors to be turned on only when the corresponding voltages are being slewed from high to low. Furthermore, as transistors 322.1, 324.1, 322.2, and 324.2 are configured to sink no current during the low-to-high (i.e., "rising edge") transitions of the corresponding voltages, the rising edge slew rate is largely unaffected and phase noise is reduced compared to the case wherein current sources are used to continuously bias transistors 322.1, 324.1, 322.2, and 324.2. The provision of the delayed signals $dV1^+$, $dV1^-$, $dV2^+$, and $dV2^-$ may be understood as providing a "dynamic" limiting (as opposed to "static" limiting) of the output voltages to save power in the circuit.

Figure 6:
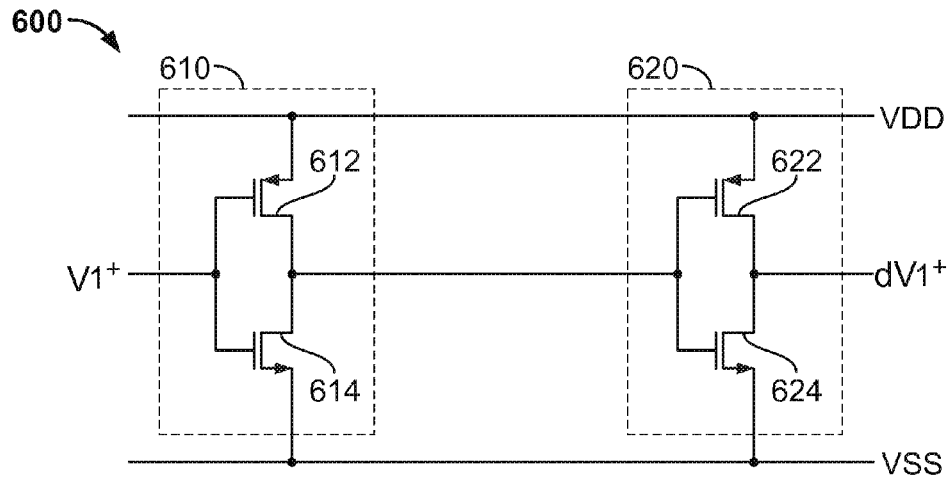
FIG. 6 illustrates an exemplary embodiment of a delay buffer for generating a delayed version $dV1^+$ of $V1^+$.

FIG. 6 illustrates an exemplary embodiment 600 of a delay buffer for generating a delayed version $dV1^+$ of $V1^+$. Note FIG. 6 is shown for illustrative purposes only, and is not meant to limit the scope of the present disclosure to any particular implementation of a delay buffer. It will be appreciated that corresponding delay buffers may be similarly implemented for generating delayed versions of the other voltages, e.g., $V1^-$, $V2^+$, and $V2^-$.

In FIG. 6, the delay buffer 600 includes a first inverting buffer 610, which includes transistors 612 and 614, and a second inverting buffer 620, which includes transistors 622 and 624. In an exemplary embodiment, the delay buffer 600 may also be used as, e.g., a mixer buffer to buffer the quadrature divider's outputs prior to driving a subsequent mixer stage for, e.g., up-conversion or down-conversion.

Figure 7:
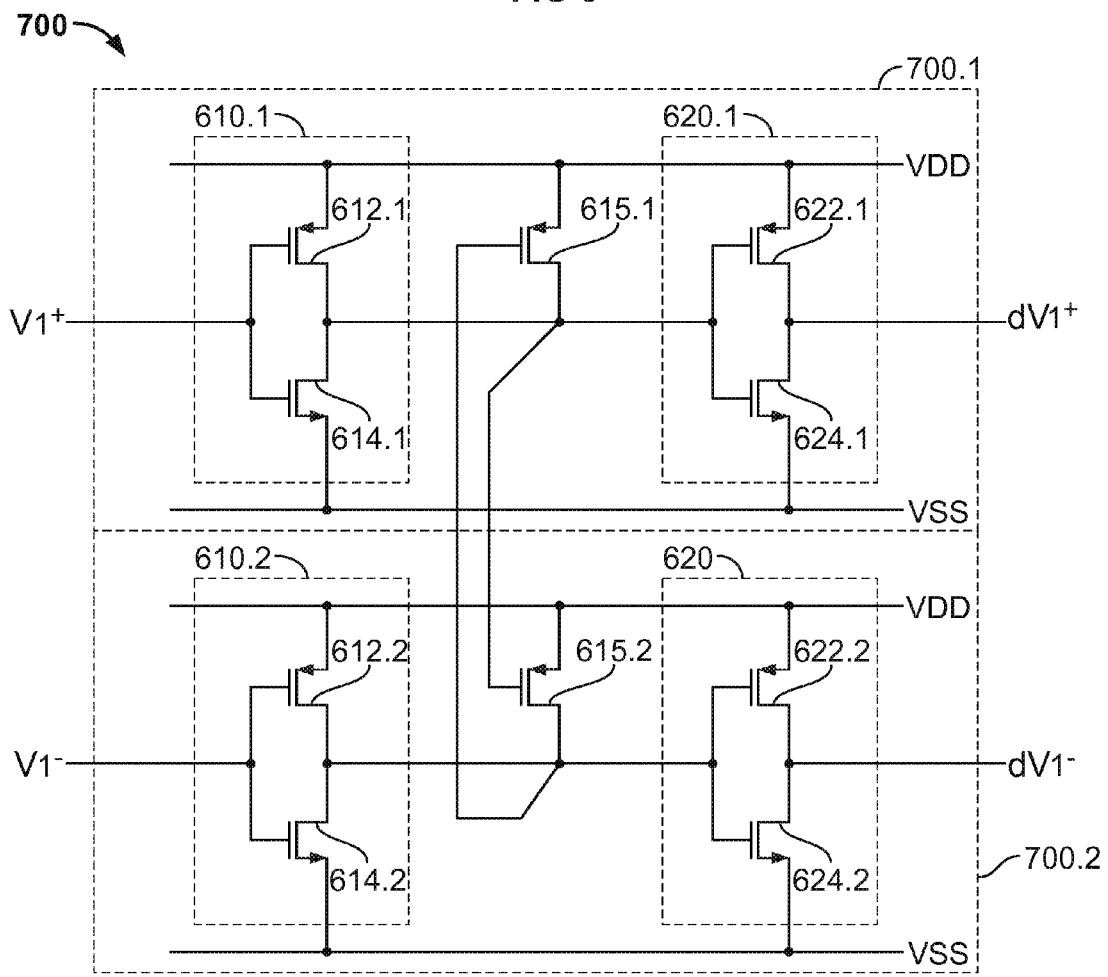
FIG. 7 illustrates an alternative exemplary embodiment of a delay buffer for generating delayed versions $dV1^+$ and $dV1^-$ of $V1^+$ and $V1^-$, respectively.

FIG. 7 illustrates an alternative exemplary embodiment 700 of a delay buffer for generating delayed versions $dV1^+$ and $dV1^-$ of $V1^+$ and $V1^-$, respectively. It will be appreciated that corresponding delay buffers may be similarly implemented for generating delayed versions of the voltages $V2^+$ and $V2^-$.

In FIG. 7, a first delay buffer 700.1 includes a first inverting buffer 610.1, a second inverting buffer 620.1, and a PMOS transistor 615.1. The first delay buffer 700.1 is configured to generate a delayed version $dV1^+$ of $V1^+$. A second delay buffer 700.2 includes a first inverting buffer 610.2, a second inverting buffer 620.2, and a PMOS transistor 615.2. The second delay buffer 700.2 is configured to generate a delayed version $dV1^-$ of $V1^-$.

The gate of the PMOS transistor 615.1 of the first delay buffer 700.1 is coupled to the drain of the PMOS transistor 615.2 of the second delay buffer 700.2, while the gate of the PMOS transistor 615.2 of the second delay buffer 700.2 is coupled to the drain of the PMOS transistor 615.1 of the first delay buffer 700.1. It will be appreciated that the transistors 615.1 and 615.2 provide additional current drive capability to the first and second delay buffers 700.1 and 700.2 to help with the low-to-high slewing of the corresponding drain nodes.

One of ordinary skill in the art will appreciate that while exemplary embodiments of the present disclosure have been described with reference to certain combinations of NMOS and PMOS transistors, alternative exemplary embodiments employing complementary versions of the transistors may be readily derive. Furthermore, while exemplary embodiments have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

Figure 8:
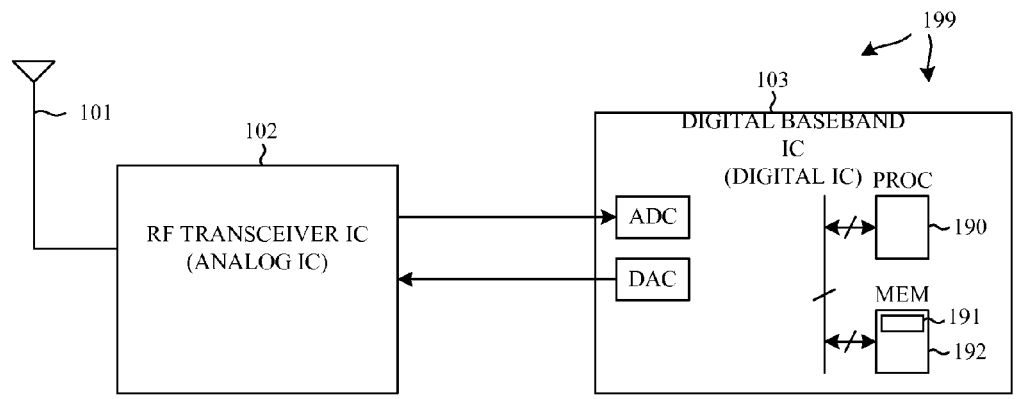
FIG. 8 is a very simplified high level block diagram of a mobile communication device such as a cellular telephone.

FIG. 8 is a simplified high level block diagram of a mobile communication device 199 such as a cellular telephone. Device 199 includes (among other parts not illustrated) an antenna 101 usable for receiving and transmitting cellular telephone communications, an RF transceiver integrated circuit 102, and a digital baseband integrated circuit 103.

Figure 9:
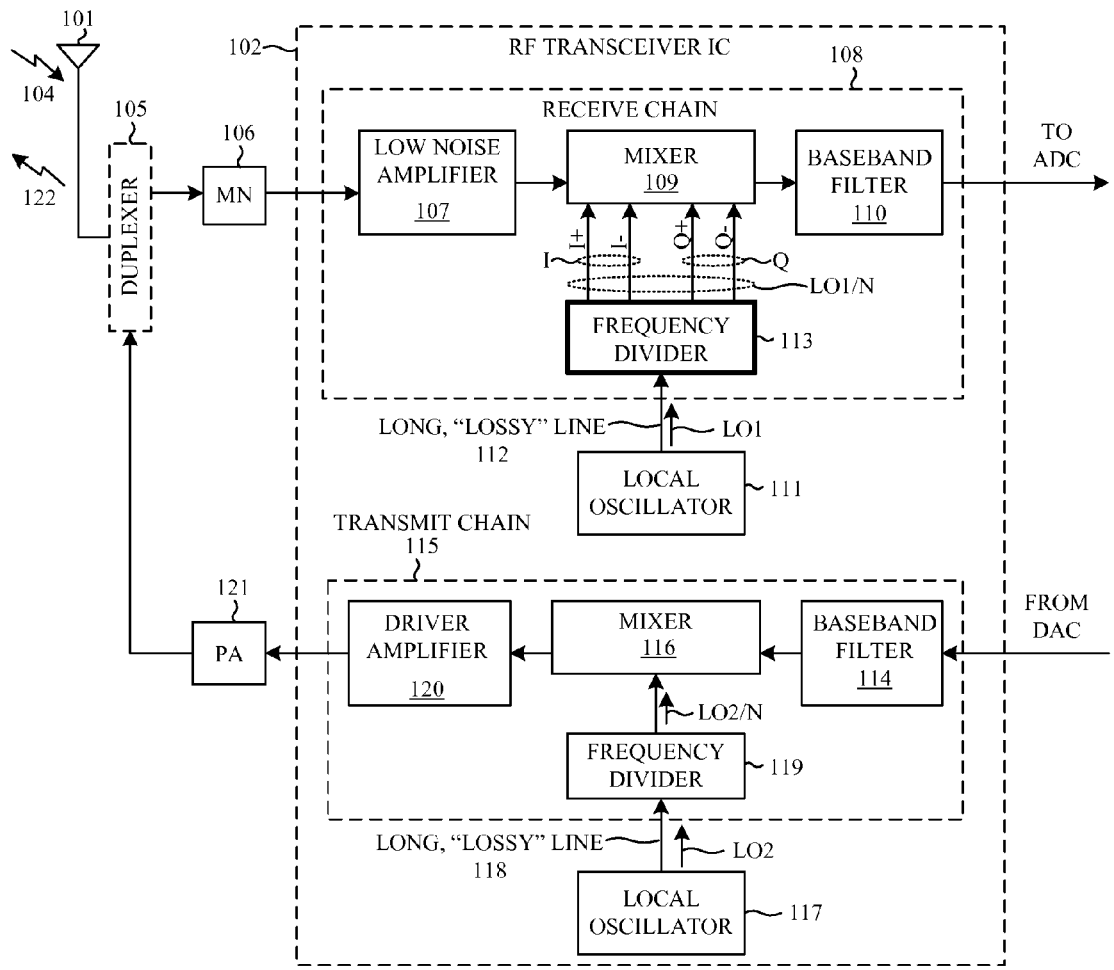
FIG. 9 is a more detailed diagram of the RF transceiver integrated circuit of FIG. 8.

FIG. 9 is a more detailed diagram of the RF transceiver integrated circuit 102 of FIG. 8. In one very simplified explanation of the operation of the cellular telephone, if the cellular telephone is being used to receive audio information as part of a cellular telephone conversation, then an incoming transmission 104 is received on antenna 101. The signal passes through duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. As part of the downconversion process, mixer 109 receives a divided-down oscillatory signal LO1/N generated by frequency divider 113 and uses this signal to downconvert information processed by the receive chain 108. What is referred to as divided-down oscillatory signal LO1/N actually includes two differential signals, I and Q. Each of differential signals I and Q is communicated across a set of two conductors. Frequency divider 113 is in close physical proximity to the circuitry of receive chain 108. Frequency divider 113 receives a local oscillator signal LO1, divides the signal in frequency by an integer N, and outputs divided-down oscillatory signal LO1/N. Local oscillator signal LO1 is generated by local oscillator 111. LO1 may, for example, be a differential signal transmitted over two conductors. In other examples, LO1 may be a single ended signal transmitted over a single conductor. LO1 is transmitted over a long, "lossy" line 112 to frequency divider 113. As explained below, signal LO1 suffers parasitic power losses during transmission across long, "lossy" line 112. These losses attenuate the peak to peak signal amplitude of LO1 and high frequency components of LO1.

If, on the other hand, the cellular telephone 199 is being used to transmit audio information as part of a cellular telephone conversation, then the audio information to be transmitted is converted into analog form in digital baseband integrated circuit 103. The analog information is supplied to a baseband filter 114 of a transmit chain 115 of RF transceiver integrated circuit 102. After filtering, the signal is upconverted in frequency by mixer 116. As part of the upconversion process, mixer 116 receives a divided-down oscillatory signal LO2/N generated by frequency divider 119 and uses this signal to upconvert information processed by the transmit chain 115. The resulting upconverted signal is amplified by a driver amplifier 120 and an external power amplifier 121. The amplified signal is supplied to antenna 101 for transmission as outgoing transmission 122. Divided-down oscillatory signal LO2/N includes two differential signals, I and Q. Frequency divider 119 receives a local oscillator signal LO2, divides the signal in frequency by an integer divisor N, and outputs divided-down oscillatory signal LO2/N. Local oscillator signal LO2 is generated by local oscillator 117. LO2 may, for example, be a differential signal transmitted over two conductors. In other examples, LO2 may be a single ended signal transmitted over a single conductor. LO2 is transmitted over a long, "lossy" line 118 to frequency divider 119 that resides in close proximity to the circuitry of transmit chain 115. During transmission over long, "lossy" line 118 signal LO2 suffers parasitic power losses that attenuate its peak to peak amplitude and high frequency components.

Figure 10:
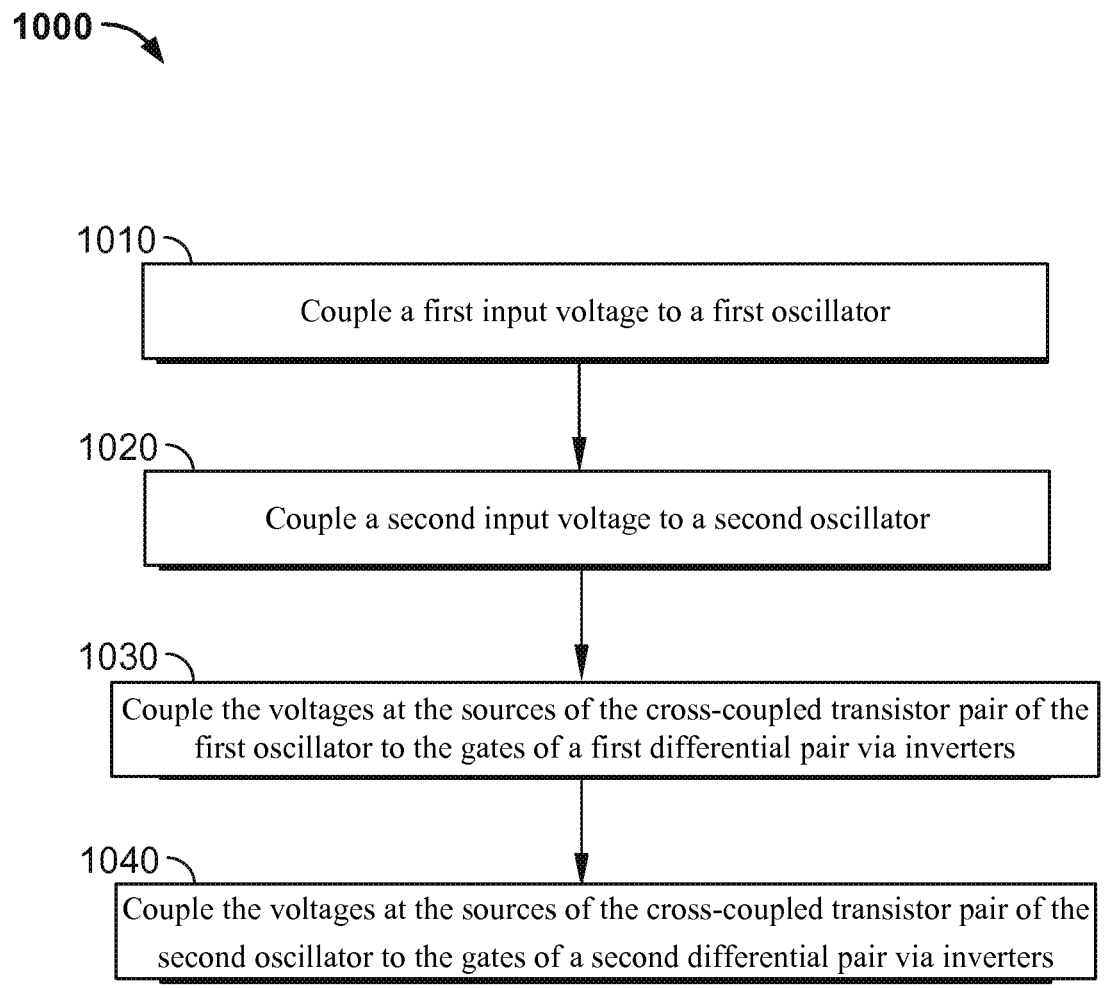
FIG. 10 illustrates an exemplary embodiment of a method according to the present disclosure.

FIG. 10 illustrates an exemplary embodiment of a method 1000 according to the present disclosure. Note the method is shown for illustrative purposes only, and is not meant to limit the scope of the present disclosure.

In FIG. 10, at block 1010, a first input voltage is coupled to a first oscillator. In an exemplary embodiment, the first oscillator comprises a cross-coupled transistor pair, a load pair coupled to the drains of the cross-coupled transistor pair, an integrating capacitor coupled to the sources of the cross-coupled transistor pair, and a pair of current injection transistors having drains coupled to the sources of the cross-coupled transistor pair. In an exemplary embodiment, the first input voltage is coupled to the gates of the pair of current injection transistors.

At block 1020, a second input voltage is coupled to a second oscillator. In an exemplary embodiment, the second oscillator comprises a cross-coupled transistor pair, a load pair coupled to the drains of the cross-coupled transistor pair, an integrating capacitor coupled to the sources of the cross-coupled transistor pair, and a pair of current injection transistors having drains coupled to the sources of the cross-coupled transistor pair. In an exemplary embodiment, the second input voltage is coupled to the gates of the pair of current injection transistors.

At block 1030, the voltages at the sources of the cross-coupled transistor pair of the first oscillator are coupled to the gates of a first differential pair via inverters. In an exemplary embodiment, the drains of the first differential pair are coupled to the drains of the cross-coupled transistor pair of the second oscillator.

At block 1040, the voltages at the sources of the cross-coupled transistor pair of the second oscillator are coupled to the gates of a second differential pair via inverters. In an exemplary embodiment, the drains of the second differential pair are coupled to the drains of the cross-coupled transistor pair of the first oscillator.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. A method comprising:
coupling a first input voltage to a first oscillator, the first oscillator comprising a cross-coupled transistor pair, a load pair coupled to the drains of the cross-coupled transistor pair, an integrating capacitor coupled to the sources of the cross-coupled transistor pair, and a pair of current injection transistors having drains coupled to the sources of the cross-coupled transistor pair, the first input voltage being coupled to the gates of the pair of current injection transistors;
coupling a second input voltage to a second oscillator, the second oscillator comprising a cross-coupled transistor pair, a load pair coupled to the drains of the cross-coupled transistor pair, an integrating capacitor coupled to the sources of the cross-coupled transistor pair, and a pair of current injection transistors having drains coupled to the sources of the cross-coupled transistor pair, the second input voltage being coupled to the gates of the pair of current injection transistors;
coupling the voltages at the sources of the cross-coupled transistor pair of the first oscillator to the gates of a first differential pair via inverters, the drains of the first differential pair coupled to the drains of the cross-coupled transistor pair of the second oscillator; and
coupling the voltages at the sources of the cross-coupled transistor pair of the second oscillator to the gates of a second differential pair via inverters, the drains of the second differential pair coupled to the drains of the cross-coupled transistor pair of the first oscillator.

2. The method of claim 1, further comprising turning on a transistor of each differential pair when the drain voltage of said transistor is being slewed from a high voltage to a low voltage.

3. The method of claim 1, further comprising coupling the source of each transistor of each differential pair to an inverted and delayed version of the drain voltage of the corresponding transistor.

4. The method of claim 3, further comprising generating the delayed version of a voltage by inverting said voltage twice in series.

5. The method of claim 4, further comprising:
generating delayed versions of the drain voltages of a cross-coupled pair by inverting each of said drain voltages twice in series;
after inverting a first drain voltage of the cross-coupled pair once, coupling the inverted first drain voltage to the drain of a first pull-up transistor;
after inverting a second drain voltage of the cross-coupled pair once, coupling the inverted second drain voltage to the drain of a second pull-up transistor;
coupling the gate of the first pull-up transistor to the inverted second drain voltage; and
coupling the gate of the second pull-up transistor to the inverted first drain voltage.

6. The method of claim 1, further comprising coupling the sources of the first differential pair to a first current source, and coupling the sources of the second differential pair to a second current source.

7. The method of claim 1, the coupling the voltages at the sources of the cross-coupled transistor pair of the first oscillator to the gates of a first differential pair further comprising coupling via AC coupling capacitors, the coupling the voltages at the sources of the cross-coupled transistor of the second oscillator to the gates of a second differential pair further comprising coupling via AC coupling capacitors.

8. The method of claim 1, each inverter comprising a self-biased inverter.

9. An apparatus comprising first and second oscillators, each of the first and second oscillators comprising:
   a cross-coupled transistor pair;
   a load pair coupled to the drains of the cross-coupled transistor pair;
   an integrating capacitor coupled to the sources of the cross-coupled transistor pair; and
   a pair of current injection transistors having drains coupled to the sources of the cross-coupled transistor pair;
   wherein the sources of the cross-coupled transistor pair of the first oscillator are coupled to the gates of a first differential pair via inverters, the drains of the first differential pair are coupled to the drains of the cross-coupled transistor pair of the second oscillator, the sources of the cross-coupled transistor pair of the second oscillator are coupled to the gates of a second differential pair via inverters, and the drains of the second differential pair are coupled to the drains of the cross-coupled transistor pair of the first oscillator.

10. The apparatus of claim 9, wherein a transistor of each differential pair is turned on when the drain voltage of said transistor is slewed from a high voltage to a low voltage.

11. The apparatus of claim 9, the source of each transistor of each differential pair being coupled to an inverted and delayed version of the drain voltage of the corresponding transistor.

12. The apparatus of claim 11, further comprising two inverters coupled in series for generating a delayed version of a drain voltage.

13. The apparatus of claim 11, further comprising first and second delay buffers for generating delayed versions of first and second drain voltages, respectively, of a cross-coupled pair, each delay buffer comprising:
   first and second inverters coupled in series;
   a pull-up transistor coupling an intermediate node between the first and second inverters to a reference voltage, the gate of the pull-up transistor of the first delay buffer being coupled to the intermediate node of the second delay buffer, and the gate of the pull-up transistor of the second delay buffer being coupled to the intermediate node of the first delay buffer.

14. The apparatus of claim 9, the sources of the first differential pair being coupled to a first current source, and the sources of the second differential pair are coupled to a second current source.

15. The apparatus of claim 9, further comprising AC coupling capacitors coupling the sources of the cross-coupled transistor pair of the first oscillator to the gates of the first differential pair, and AC coupling capacitors coupling the sources of the cross-coupled transistor pair of the second oscillator to the gates of the second differential pair.

16. The apparatus of claim 9, each inverter comprising a self-biased inverter.

17. An apparatus comprising:
   means for generating a first differential oscillating voltage;
   means for generating a second differential oscillating voltage, the first and second differential oscillating voltages having a quadrature phase relationship with one another; and
   means for increasing the slew rate of the first and second differential oscillating voltages, said means for increasing the slew rate comprising inverters coupling the gates of a differential pair to voltages having a fixed phase relationship with the first or second differential oscillating voltages.

18. The apparatus of claim 17, further comprising means for discontinuously powering on the means for increasing the slew rate.

19. An apparatus comprising first and second oscillators, each of the first and second oscillators comprising:
   a cross-coupled transistor pair;
   a load pair coupled to the drains of the cross-coupled transistor pair;
   an integrating capacitor coupled to the sources of the cross-coupled transistor pair; and
   a pair of current injection transistors having drains coupled to the sources of the cross-coupled transistor pair;
   wherein the sources of the cross-coupled transistor pair of the first oscillator are coupled to the gates of a first differential pair, the drains of the first differential pair are coupled to the drains of the cross-coupled transistor pair of the second oscillator, the sources of the cross-coupled transistor pair of the second oscillator are coupled to the gates of a second differential pair, and the drains of the second differential pair are coupled to the drains of the cross-coupled transistor pair of the first oscillator; wherein a transistor of each differential pair is turned on when the drain voltage of said transistor is slewed from a high voltage to a low voltage.

* * * * *